(12) United States Patent
Kujirai et al.

(10) Patent No.: US 7,687,849 B2
(45) Date of Patent: Mar. 30, 2010

(54) METHOD FOR MANUFACTURING SEMICONDUCTOR INTEGRATED CIRCUIT DEVICE

(75) Inventors: Hiroshi Kujirai, Kunitachi (JP); Kousuke Okuyama, Kawagoe (JP); Kazuhiro Hata, Akishima (JP); Kiyonori Oyu, Ome (JP); Ryo Nagai, Nishitama (JP); Hiroyuki Uchiyama, Tachikawa (JP); Takahiro Kumauchi, Hamura (JP); Teruhisa Ichise, Ome (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/128,796

(22) Filed: May 29, 2008

(65) Prior Publication Data

US 2008/0237752 A1    Oct. 2, 2008

Related U.S. Application Data

(63) Continuation of application No. 11/785,463, filed on Apr. 18, 2007, now Pat. No. 7,417,291, which is a continuation of application No. 10/978,469, filed on Nov. 2, 2004, now Pat. No. 7,224,034, which is a continuation of application No. 10/223,317, filed on Aug. 20, 2002, now Pat. No. 6,828,242.

(30) Foreign Application Priority Data

Aug. 23, 2001    (JP) .............................. 2001-253028

(51) Int. Cl.
 *H01L 29/788* (2006.01)
(52) U.S. Cl. ..................................... 257/320; 257/411

(58) Field of Classification Search .................. 257/316, 257/319, 320, 321, 411, E21.654, E27.084, 257/E29.152
See application file for complete search history.

(56) References Cited

U.S. PATENT DOCUMENTS 5,545,578 A    8/1996  Park et al.

(Continued)

FOREIGN PATENT DOCUMENTS

| JP | 11-261059 | 9/1999 |
|---|---|---|
| JP | 2001-36072 | 5/2000 |

OTHER PUBLICATIONS

A fully Working 0.14 µm Dram Technology With Polymetal Gate, Jung et al IEDM 2000 pp. 365-368.

*Primary Examiner*—David Vu
(74) *Attorney, Agent, or Firm*—Antonelli, Terry, Stout & Kraus, LLP.

(57) ABSTRACT

Disclosed is a technique for reducing the leak current by reducing contamination of metal composing a polymetal gate of a MISFET. Of a polycrystalline silicon film, a WN film, a W film, and a cap insulating film formed on a gate insulating film on a p-type well (semiconductor substrate), the cap insulating film, the W film, and the WN film are etched and the over-etching of the polycrystalline silicon film below them is performed. Then, a sidewall film is formed on sidewalls of these films. Thereafter, after etching the polycrystalline silicon film with using the sidewall film as a mask, a thermal treatment is performed in an oxidation atmosphere, by which a light oxide film is formed on the sidewall of the polycrystalline silicon film. As a result, the contamination on the gate insulating film due to the W and the W oxide can be reduced, and also, the diffusion of these materials into the semiconductor substrate (p-type well) and the resultant increase of the leak current can be prevented.

15 Claims, 14 Drawing Sheets

U.S. PATENT DOCUMENTS

| | | |
|---|---|---|
| 5,796,151 A | 8/1998 | Hsu et al. |
| 6,287,914 B1 * | 9/2001 | Uchiyama et al. ........... 438/243 |
| 6,417,084 B1 | 7/2002 | Singh |
| 6,448,140 B1 | 9/2002 | Liaw |
| 6,458,646 B1 | 10/2002 | Divakaruni |
| 6,566,236 B1 | 5/2003 | Syau et al. |

* cited by examiner

METHOD FOR MANUFACTURING SEMICONDUCTOR INTEGRATED CIRCUIT DEVICE

CROSS REFERENCE TO RELATED APPLICATION

This application is a continuation application of U.S. Ser. No. 11/785,463, filed Apr. 18, 2007, now U.S. Pat. No. 7,417,291 which is a continuation application of U.S. Ser. No. 10/978,469, filed Nov. 2, 2004, now U.S. Pat. No. 7,224,034 which is a continuation application of U.S. Ser. No. 10/223,317, filed Aug. 20, 2002, now U.S. Pat. No. 6,828,242 the contents of each of which are incorporated herein by reference.

TECHNICAL FIELD OF THE INVENTION

The present invention relates to a semiconductor integrated circuit device and a technique of manufacturing the same, more particularly, the present invention relates to a gate structure of a fine MISFET (Metal Insulator Semiconductor Field Effect Transistor) and a technique effectively applied to a method of manufacturing the same.

BACKGROUND OF THE INVENTION

A so-called polymetal gate in which refractory metal such as tungsten is laminated on a polycrystalline silicon film is adopted in order to lower the resistance of the gate electrode of the MISFET.

Meanwhile, a so-called light oxidation treatment for forming a thermal oxide film on a sidewall of the gate electrode is performed in the etching of the gate electrode because a gate insulating film under the gate electrode is also caused to be etched in the etching so that the withstand voltage of the gate insulating film is deteriorated.

For example, the gazette of Japanese Patent Laid-Open No. 2001-36072 discloses a technique for preventing the oxidation of a metal layer by means of protecting the sidewalls of the metal layer composing the polymetal gate.

Also, the gazette of Japanese Patent Laid-Open No. 11-261059 discloses a technique for forming a low-resistance transistor with no metal contamination. According to this technique, the low-resistance transistor without metal contamination is formed by covering the exposed portion of a metal composing the polymetal gate of the transistor with a film of LPCVD-HTO or SiN9, and then by processing a polysilicon film 3 below it.

Also, in "A fully working 0.14 µm DRAM technology with polymetal (W/WNx/Poly-Si) gate" by J. W. Jung et al. in the IEDM 2000 pp. 365-368, disclosed is a cleaning technique using $H_2SO_4$ and purified water performed after the etching for a gate electrode made of W/WN$_x$ and poly-Si.

SUMMARY OF THE INVENTION

The inventors have been engaged in the research and development of the data transfer MISFET and the DRAM (Dynamic Random Access Memory) including a data storage capacitor connected in series to the data transfer MISFET. The inventors had been examining the introduction of a polymetal gate electrode capable of lowering resistance in comparison to the conventional polycide gate into the gate electrode of the data transfer MISFET.

However, it had been frequently found that the product adopting such a polymetal gate structure has a tendency to increase the leak current. As a result, it had been difficult to adopt the polymetal gate for the product with severe restriction in the leak current value.

In such a circumstance, the inventors have intensely examined the increase of the leak current like this. As a result, the inventors have reached the conclusion that the diffusion of metal (metal contamination) composing the polymetal gate into the semiconductor substrate causes the increase of the leak current as described later in detail.

An object of the present invention is to reduce the leak current of the MISFET by reducing the contamination of the metal composing the polymetal gate.

Also, another object of the present invention is to improve the retention characteristic of a memory cell including the MISFET by reducing the leak current in the MISFET.

Also, another object of the present invention is to improve the performance of the semiconductor integrated circuit device having the MISFET by reducing the leak current in the MISFET. Still another object of the present invention is to improve the yield of the semiconductor integrated circuit device.

The above and other objects and novel characteristic of the present invention will be apparent from the descriptions and the accompanying drawings of this specification.

The typical ones of the inventions disclosed in this application will be briefly described as follows.

(1) A method of manufacturing a semiconductor integrated circuit device according to the present invention comprises the steps of: performing etching to remove a second insulating film, a refractory metal film, and a predetermined thickness of a silicon film, which are deposited on a first insulating film formed on a semiconductor substrate, so as not to expose the first insulating film; selectively forming a third insulating film on a sidewall of the silicon film and on a sidewall of the refractory metal film; removing a part of the silicon film not covered with the third insulating film; and performing a thermal treatment to a surface of the silicon film in an oxidation atmosphere.

(2) Also, a semiconductor integrated circuit device according to the present invention comprises: a first insulating film formed on a main surface of a semiconductor substrate; a silicon film formed on the first insulating film, which has a first sidewall on a part contacting to the first insulating film and a second sidewall on a part apart from the first insulating film; a refractory metal film formed on the silicon film and having a third sidewall; a second insulating film covering the second and third sidewalls; and a third insulating film positioned between the first and second insulating films and covering the first sidewall.

(3) Also, the semiconductor integrated circuit device is characterized in that the first and third insulating films are oxide films, and the second insulating film is a silicon nitride film.

(4) Also, the semiconductor integrated circuit device is characterized in that the first sidewall is at a position away from the second insulating film in comparison to the position of the second sidewall.

(5) Also, the semiconductor integrated circuit device is characterized in that the first and second sidewalls are almost perpendicular to the main surface of the semiconductor substrate.

(6) Also, the semiconductor integrated circuit device is characterized in that the silicon film is interposed between the third insulating film and the refractory metal film.

(7) Also, a semiconductor integrated circuit device according to the present invention comprises: a semiconductor substrate having a main surface; a pair of semiconductor regions formed over the main surface of the semiconductor substrate; a silicon film formed over the main surface of the semiconductor substrate via a first insulating film in a region between the pair of semiconductor regions; a refractory metal film formed on the silicon film; a second insulating film, which covers a sidewall of the refractory metal film and a sidewall of the silicon film; and a third insulating film, which covers a sidewall of the silicon film, wherein the third insulating film is at a position between the first insulating film and the second insulating film.

(8) Also, the semiconductor integrated circuit device is characterized in that the second insulating film is a silicon nitride film, and the first and third insulating films are silicon oxide films.

(9) Also, the semiconductor integrated circuit device further comprises: a fourth insulating film positioned on the refractory metal film, a sidewall of which is covered with the second insulating film.

(10) Also, the semiconductor integrated circuit device is characterized in that the second and fourth insulating films are silicon nitride films, and the first and third insulating films are silicon oxide films.

(11) Also, the semiconductor integrated circuit device is characterized in that, with respect to the direction from one semiconductor region to the other semiconductor region, a width of the silicon film close to the first insulating film is smaller than that of the silicon film close to the refractory metal film.

(12) Also, the semiconductor integrated circuit device is characterized in that, with respect to the direction from one semiconductor region to the other semiconductor region, a width of the silicon film close to the first insulating film is wider than that of the silicon film close to the refractory metal film.

(13) Also, the semiconductor integrated circuit device is characterized in that the silicon film is interposed between the third insulating film and the refractory metal film.

BRIEF DESCRIPTIONS OF THE DRAWINGS

Figure 20:
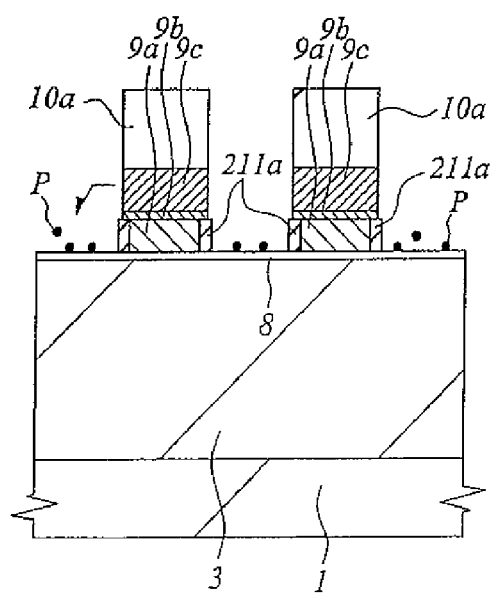
Figure 21:
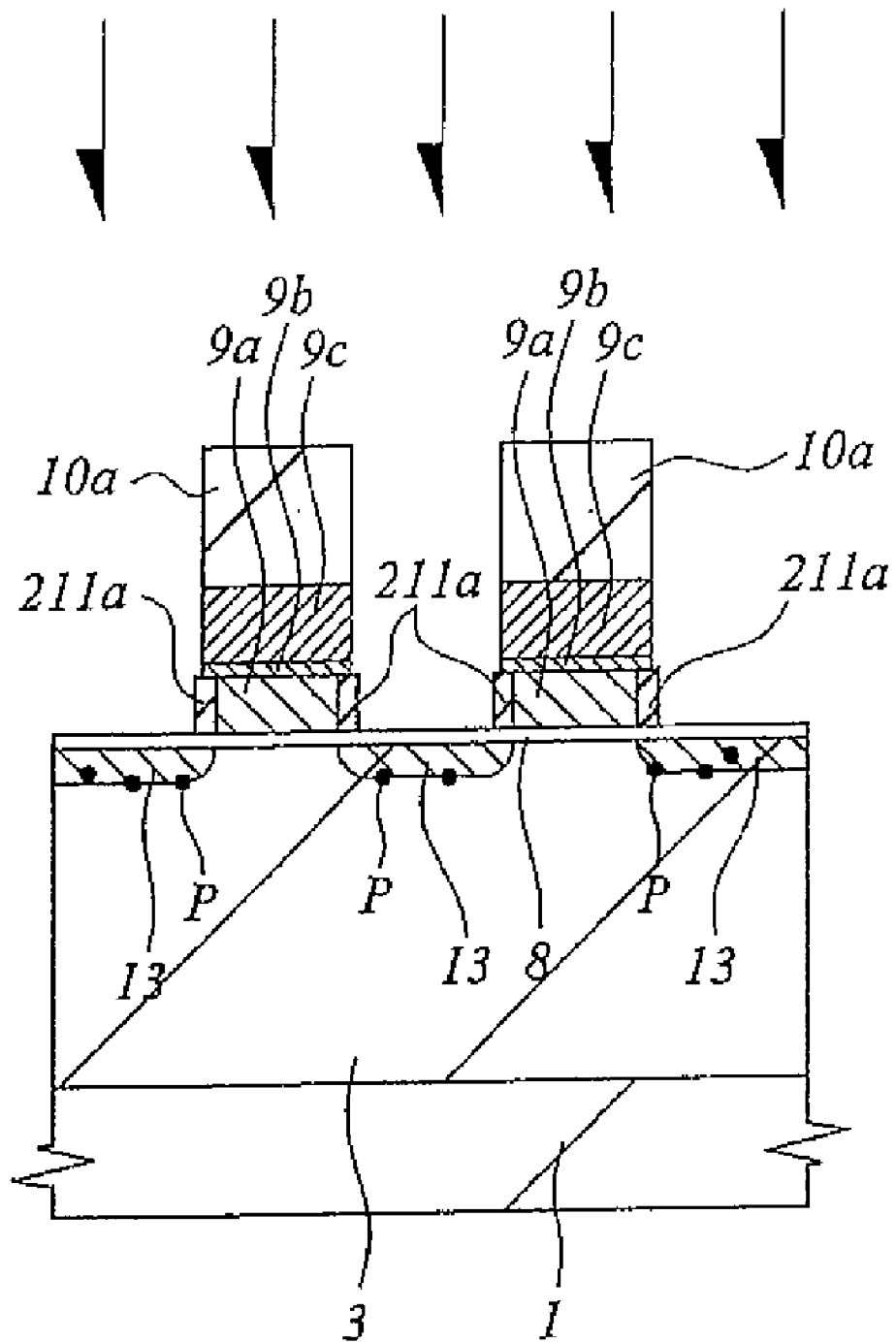

FIG. 20 is a sectional view showing the principal part of a substrate illustrating the method of manufacturing a semiconductor integrated circuit device (DRAM), which is used to explain the effect of an embodiment of the present invention; and FIG. 21 is a sectional view showing the principal part of a substrate illustrating the method of manufacturing a semiconductor integrated circuit device (DRAM), which is used to explain the effect of an embodiment of the present invention.

DESCRIPTION OF THE PREFERRED EMBODIMENTS

Hereinafter, an embodiment of the present invention will be described in detail based on the accompanying drawings. Note that, in all of the drawings for describing the embodiments, components having the same function are denoted by the same reference symbols and the repetitive descriptions thereof will be omitted.

The method of manufacturing a DRAM according to the embodiment of the present invention will be described with reference to FIGS. 1 to 18 along with the manufacturing steps performed.

Figure 1:
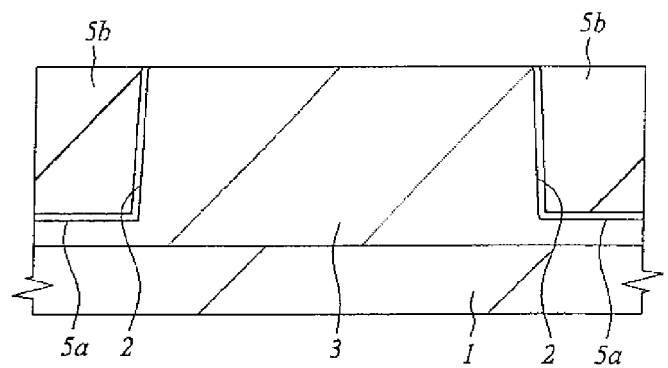
FIG. 1 is a sectional view showing the principal part of a substrate illustrating the method of manufacturing a semiconductor integrated circuit device (DRAM) according to an embodiment of the present invention.

First, as shown in FIG. 1, a semiconductor substrate 1 made of p-type single crystal silicon having the specific resistance of about 1 to 10 Ωcm is etched to form an element isolation trench with a depth of about 350 nm.

Then, the thermal oxidation at about 1000° C. is performed to the semiconductor substrate 1, thereby forming a thin silicon oxide film 5a with a thickness of about 10 nm on an inner wall of the trench. The silicon oxide film 5a is formed in order to recover the damages due to the dry etching on the inner wall of the trench and to relax the stress at the interface between the semiconductor substrate 1 and a silicon oxide film 5b buried in the trench in the next step.

Next, the silicon oxide film 5b is deposited to a thickness of about 450 to 500 nm by the CVD (Chemical Vapor Deposition) method over the semiconductor substrate 1 including the inside of the trench, and then, the silicon oxide film 5b on the trench is polished by the CMP (Chemical Mechanical Polishing) method to flatten the surface. Thus, an element isolation 2 is formed.

Figure 2:
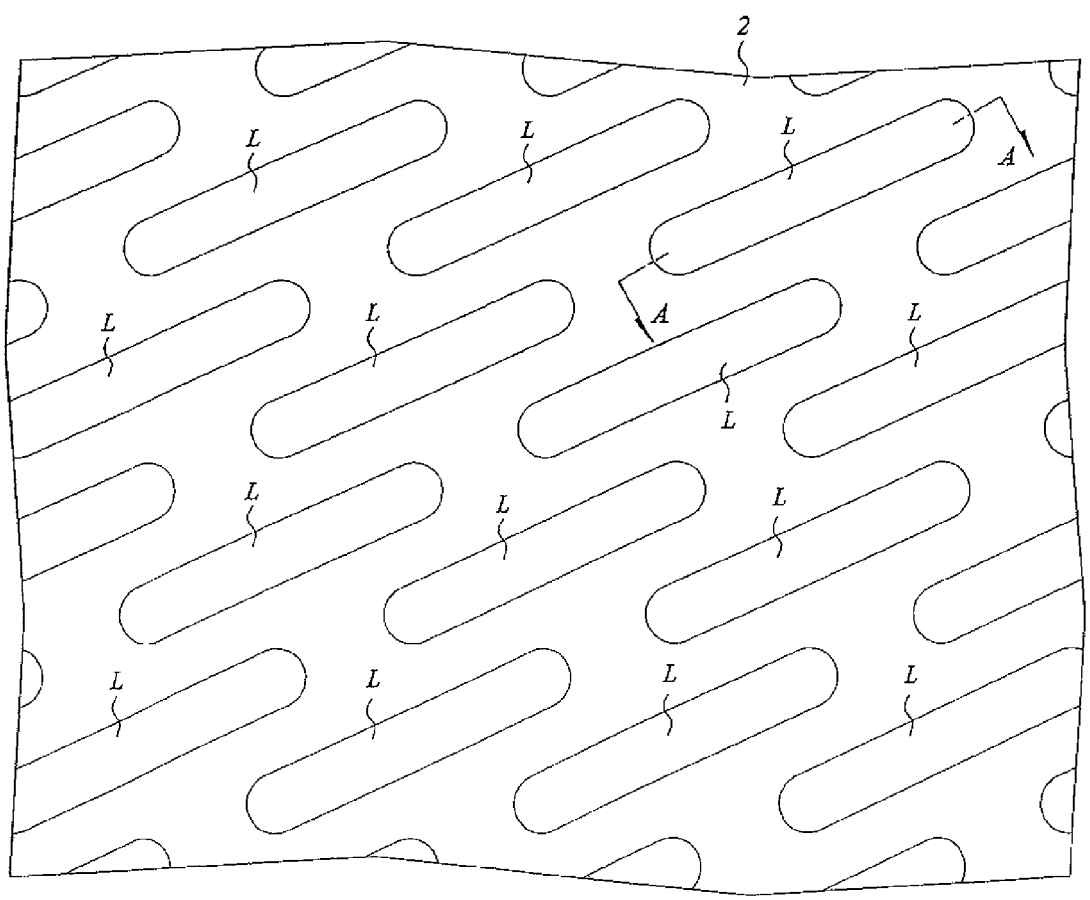
FIG. 2 is a plan view showing the principal part of a substrate illustrating the method of manufacturing a semiconductor integrated circuit device (DRAM) according to an embodiment of the present invention.

As shown in FIG. 2, the formation of the element isolation 2 simultaneously forms active regions (L) in a thin island shape surrounded by the element isolation 2. Two data transfer MISFETs Q which share a common source or a common drain are formed on each of the active regions (L). FIG. 1 corresponds, for example, to the section taken along the line A-A in FIG. 2.

Next, after implanting ions of p-type impurities (boron) into the semiconductor substrate 1, the thermal treatment at about 1000° C. is performed to diffuse the impurities, thereby forming a p-type well 3 on the semiconductor substrate 1 (refer to FIG. 1).

Figure 3:
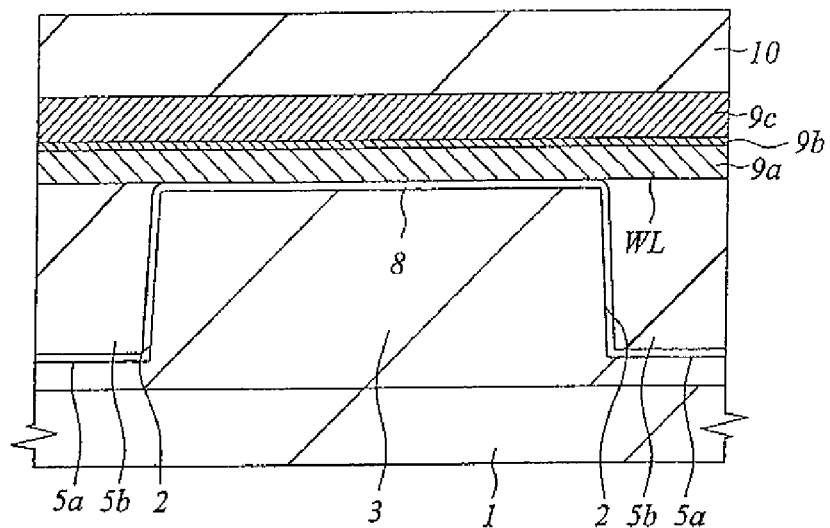
FIG. 3 is a sectional view showing the principal part of a substrate illustrating the method of manufacturing a semiconductor integrated circuit device (DRAM) according to an embodiment of the present invention.

Next, as shown in FIG. 3, a surface of the semiconductor substrate 1 (p-type well 3) is wet-cleaned with a cleaning solution containing hydrofluoric acid. Thereafter, by the thermal oxidation at about 800° C., a clean gate insulating film 8 with a thickness of about 6 nm is formed on a surface of the p-type well 3.

Next, a low-resistance polycrystalline silicon film 9a doped with phosphorus (P) is deposited to a thickness of about 70 nm on a gate insulating film 8 by the CVD method. Subsequently, a WN (tungsten nitride) film 9b with a thickness of about 5 nm and a W (tungsten) film 9c with a thickness of about 80 nm are deposited thereon by the sputtering method, and a silicon nitride film 10 with a thickness of about 200 nm is deposited further thereon by the CVD method. Note that the WN film 9b is formed in order to prevent the polycrystalline silicon film 9a and the W film 9c from forming an undesirable silicide layer. Furthermore, although the W film 9c is used in this embodiment, it is also possible to use other refractory metal film such as a Ti (titanium) film.

Figure 4:
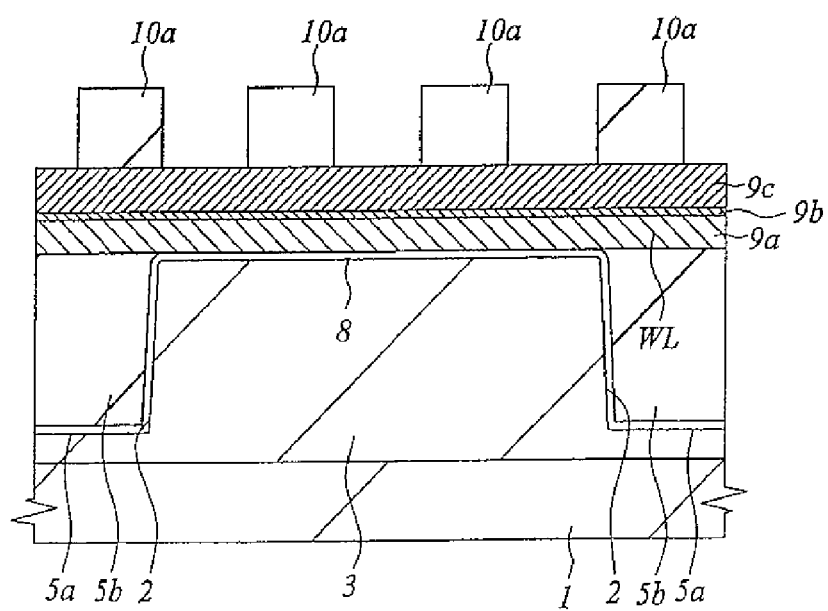
FIG. 4 is a sectional view showing the principal part of a substrate illustrating the method of manufacturing a semiconductor integrated circuit device (DRAM) according to an embodiment of the present invention.

Next, as shown in FIG. 4, a silicon nitride film 10 is dry-etched with using a photoresist film (not shown) as a mask. Thus, a cap insulating film 10a made of a silicon nitride film is formed in a region in which a gate electrode is formed. Subsequently, the resist (not shown) left on the cap insulating film 10a is removed.

Next, the W film 9c, the WN film 9b, and the polycrystalline silicon film 9a are dry-etched with using the cap insulating film 10a as a mask, thereby forming a gate electrode 9 (word line WL) including these films. In particular, the steps of forming the gate electrode 9 will be described in detail with reference to the FIGS. 5 to 13. Note that FIGS. 5 to 13 are enlarged views showing the part near the cap insulating film 10a.

Figure 5:
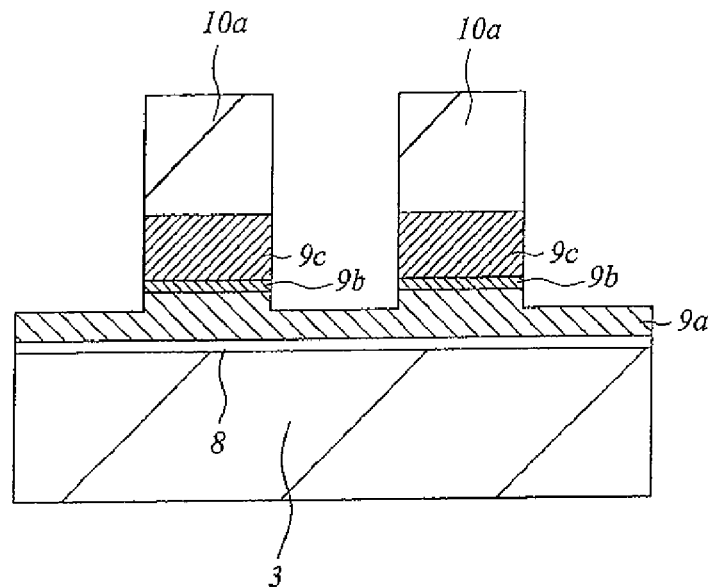
FIG. 5 is a sectional view showing the principal part of a substrate illustrating the method of manufacturing a semiconductor integrated circuit device (DRAM) according to an embodiment of the present invention.

First, as shown in FIG. 5, the W film 9c and the WN film 9b are dry-etched with using the cap insulating film 10a as a mask, and then, the over-etching of the polycrystalline silicon film 9a is performed so that about 10 to 40 nm thereof is etched. Note that the etching amount of the polycrystalline silicon film 9a in this etching is appropriately controlled within the range in which the polycrystalline silicon film 9a is left and the semiconductor substrate 1 (gate insulating film 8) is not exposed in the step of forming the light oxide film described later.

The reason why the polycrystalline silicon film 9a is left over the semiconductor substrate 1 (on the gate insulating film 8) will be described below.

Figure 19:
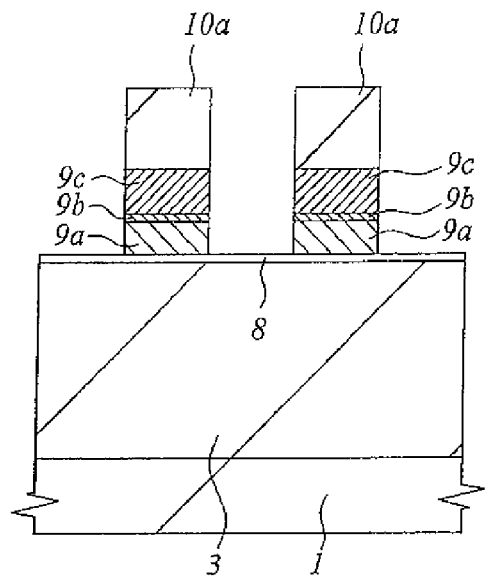
FIG. 19 is a sectional view showing the principal part of a substrate illustrating the method of manufacturing a semiconductor integrated circuit device (DRAM), which is used to explain the effect of an embodiment of the present invention.

For example, as shown in FIG. 19, if all of the W film 9c, the WN film 9b, and the polycrystalline silicon film 9a are etched with using the cap insulating film 10a as a mask, the gate insulating film 8 is exposed. Also, the steps of forming a light oxide film 211a as shown in FIG. 20 on the sidewall of the polycrystalline silicon film 9a and forming a silicon nitride film over the semiconductor substrate 1 are performed thereafter. In these steps, W and W oxide (e.g., $WO_3$) are adhered onto the gate insulating film 8. Particularly, since the light oxide film 211a is formed under the oxidation atmosphere, the sublimated W (metal) and oxygen are reacted to produce W oxide in many cases. The W and W oxide P adhered onto the gate insulating film 8 are diffused into the semiconductor substrate 1 by the following ion implantation process and the thermal treatment, which causes the leak current (FIG. 21).

In this embodiment, however, the polycrystalline silicon film 9a is left on the gate insulating film 8, and as described later, the sidewall of the W film 9c and that of the WN film 9b are covered with a sidewall film SW before the semiconductor substrate 1 (gate insulating film 8) is exposed. Therefore, the metal contamination on the gate insulating film 8 in the step of forming a light oxide film can be reduced. As a result, it is possible to achieve the reduction of the leak current in the data transfer MISFET Qs. Consequently, the retention characteristic of the DRAM memory cell can be improved.

Figure 6:
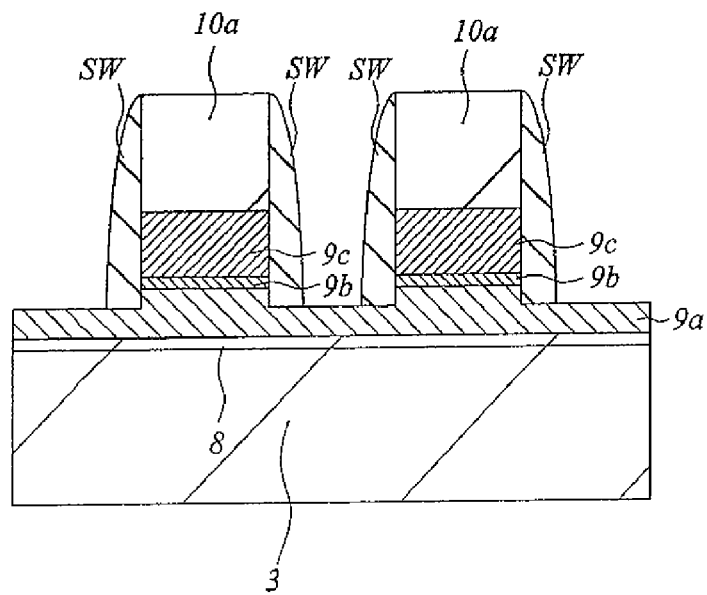
FIG. 6 is a sectional view showing the principal part of a substrate illustrating the method of manufacturing a semiconductor integrated circuit device (DRAM) according to an embodiment of the present invention.

Next, as shown in FIG. 6, a silicon nitride (SiN) film is deposited to a thickness of about 10 to 20 nm by the LPCVD (Low Pressure Chemical Vapor Deposition) method over the semiconductor substrate 1 and then the anisotropic etching is performed thereto, by which sidewall films (insulating film) SW are formed on the sidewalls of the W film 9c, the WN film 9b, and the polycrystalline silicon film 9a which have been exposed by the above-described dry etching. The LPCVD method enables to accurately form a silicon nitride film even in a fine trench.

Next, the cleaning is performed to remove foreign matters such as organic matters and heavy metal (W and W oxide described above) over the semiconductor substrate 1 (on the cap insulating film 10a and polycrystalline silicon film 9a). The organic matters exist in a clean room in which the semiconductor substrate 1 is processed and adhere onto the semiconductor substrate 1. Also, the heavy metal adheres onto the semiconductor substrate 1, for example, when performing the dry etching of the W film 9c and the WN film 9b. In addition, the heavy metal may adhere thereto when depositing the silicon nitride film. For the removal of the organic matters, cleaning with a cleaning solution containing, for example, $H_2O_2$ (hydrogen peroxide) and $NH_4OH$ (ammonia) is performed. Also, for the removal of the heavy metal, cleaning with a cleaning solution containing, for example, $H_2O_2$ (hydrogen peroxide) and NCl (hydrochloric acid) is performed.

As described above, according to the embodiment, since the sidewall film SW is formed on the sidewalls of the W film 9c, the WN film 9b, and the polycrystalline silicon film 9a, it is possible to use a cleaning solution containing strong acid such as $H_2O_2$ in the cleaning for removing foreign matters such as the organic matters, heavy metal, and the like.

More specifically, in the case where the W film 9c and the WN film 9b are not covered, since the W contained therein is oxidized extremely easily, it is impossible to use a cleaning solution containing strong acid such as $H_2O_2$ in the cleaning, and there has been no other choice but the cleaning which uses a pure water or a solution containing low-concentration HF (hydrogen fluoride). As a result, a sufficient removal of the organic matters and the heavy metal can not be performed, and thus, the characteristics of the semiconductor device such as a MISFET are deteriorated. In particular, as described above, when the removal of the metal layer is insufficient, the heavy metal left on the surface of the semiconductor substrate 1 enters the semiconductor substrate 1 by the following ion implantation and the thermal treatment, resulting in the increase in the leak current.

However, in this embodiment, since the sidewall film SW is formed on the sidewalls of the W film 9c and WN film 9b, it is possible to use a cleaning solution containing $H_2O_2$ in the cleaning and to sufficiently remove the organic matters and the heavy metals.

Figure 7:
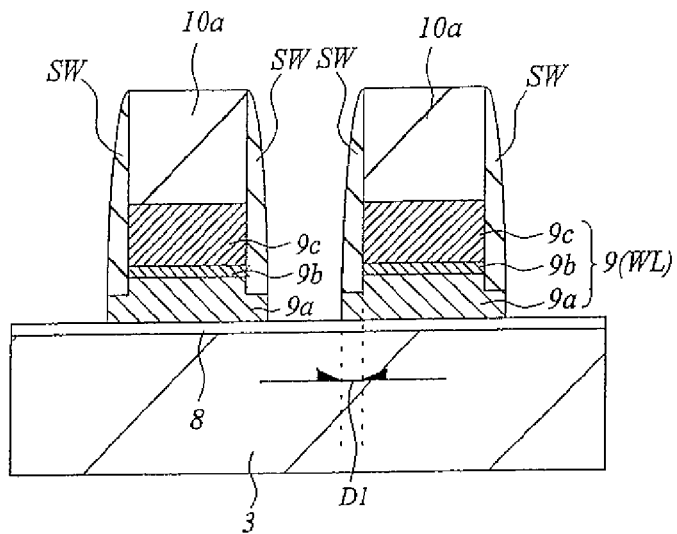
FIG. 7 is a sectional view showing the principal part of a substrate illustrating the method of manufacturing a semiconductor integrated circuit device (DRAM) according to an embodiment of the present invention.

Next, as shown in FIG. 7, the polycrystalline silicon film 9a is dry-etched with using the sidewall film SW as a mask. This dry etching forms the gate electrode 9 comprising the W film 9c, the WN film 9b, and the polycrystalline silicon film 9a.

Also, a film thickness D1 of the sidewall film SW after the dry etching is about 5 nm. To leave the sidewall film SW with a thickness of 5 nm as described above, the etching selectivity (Etch SiN/Etch Si) of 14 to 15 is required between the polycrystalline silicon film 9a and the silicon nitride film.

Next, the cleaning to remove the foreign matters such as organic matters and heavy metal on the surface of the semiconductor substrate 1 is performed. As described above, according to the embodiment, since the sidewall film SW is formed on the sidewalls of the W film 9c and the WN film 9b, it is possible to use the cleaning solution containing strong acid such as $H_2O_2$ in the cleaning to remove the foreign matters such as the organic matters and heavy metal.

Figure 8:
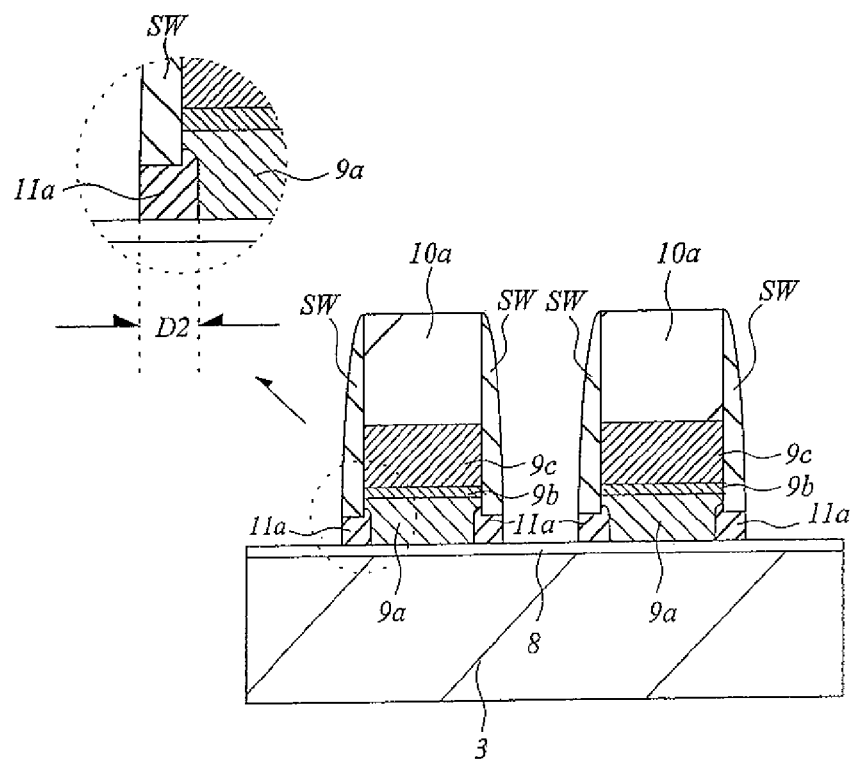
FIG. 8 is a sectional view showing the principal part of a substrate illustrating the method of manufacturing a semiconductor integrated circuit device (DRAM) according to an embodiment of the present invention.

Next, as shown in FIG. 8, the thermal treatment at 800° C. is performed in the oxidation atmosphere (in the atmosphere containing $O_2$) to form a thin oxide film (hereinafter, referred to as a light oxide film) 11a with a thickness (D2) of about 7 nm on the sidewalls of the polycrystalline silicon film 9a. The light oxide film (insulating film) 11a is formed in order to recover the damages on the gate insulating film 8 positioned under the end portion of the polycrystalline silicon film 9a caused when performing the etching of the polycrystalline silicon film 9a.

As described above, when forming the light oxide film 11a, the sidewalls of the W film 9c, the WN film 9b, and (a part of) the polycrystalline silicon film 9a has been covered with the sidewall film SW. Therefore, the metal contamination on the gate insulating film 8 can be reduced. As a result, the reduction in the leak current of the data transfer MISFET Qs can be achieved, and the improvement of the retention characteristic of the DRAM memory cell can be also achieved.

Also, according to the embodiment, since the sidewall film SW is formed on the sidewalls of the W film 9c and the WN film 9b, it is possible to form the light oxide film 11a by the so-called dry oxidation, and thus, the characteristic of the MISFET can be improved. The dry oxidation mentioned here indicates an oxidation performed in the atmosphere containing no hydrogen ($H_2$).

Figure 9:
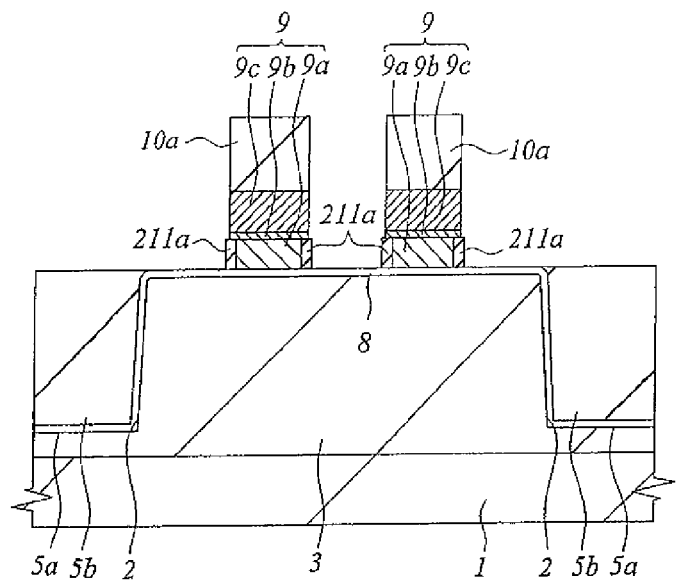
FIG. 9 is a sectional view showing the principal part of a substrate illustrating a semiconductor integrated circuit device (DRAM), which is used to explain the effect of an embodiment of the present invention.

More specifically, if performing the dry oxidation in a state where the W film 9c, the WN film 9b and the polycrystalline silicon film 9a are not covered, the abnormal oxidation is caused in the W film and the like. Therefore, there has been no choice but to use the wet hydrogen oxidation capable of selectively oxidizing only the silicon (polycrystalline silicon film 9a). In this wet hydrogen oxidation, oxidation process is performed in the atmosphere containing water vapor ($H_2O$) and hydrogen, and the condition that the silicon (9a) is oxidized but the W (9b and 9c) are not oxidized can be selected by controlling the partial pressure of hydrogen. A sectional view showing the principal part of the substrate in the case where the light oxide film 211a is formed by the wet hydrogen oxidation is shown in FIG. 9.

Figure 10:
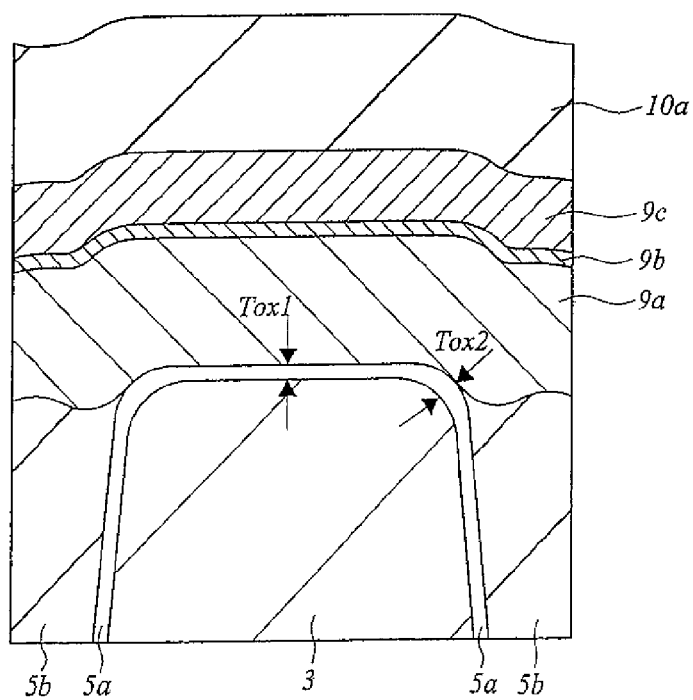
FIG. 10 is a sectional view showing the principal part of a substrate illustrating a semiconductor integrated circuit device (DRAM), which is used to explain the effect of an embodiment of the present invention.
Figure 11:
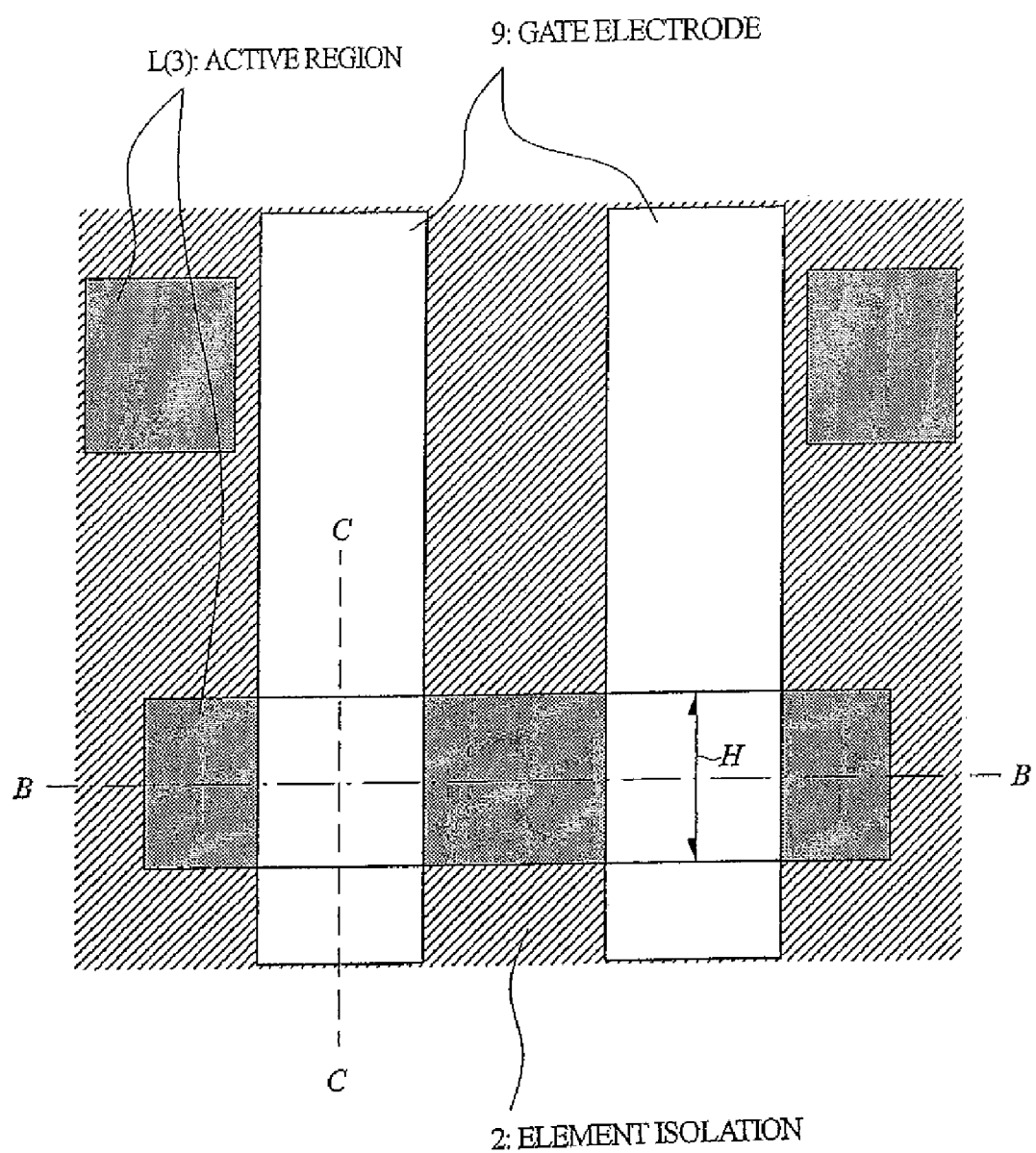
FIG. 11 is a plan view showing the principal part of a substrate illustrating a semiconductor integrated circuit device (DRAM), which is used to explain the effect of an embodiment of the present invention.

However, in this wet hydrogen oxidation, oxidation species (groups and atoms causing the oxidation) are OH groups, and the oxidation species enter the active regions L (exposed part of the p-type well 3) through the oxide film of the element isolation. As a result, the thickness of the silicon oxide film 5a is increased and the lower portion of the polycrystalline silicon film 9a composing the gate electrode is oxidized. Such a reaction is remarkable at the interface between the element isolation 2 and the active region L on the surface of the semiconductor device, and as shown in FIG. 10, the oxide film thickness (Tox2) in such a portion becomes larger than the gate insulating film thickness (Tox1). As a result, the problem of the variation in the characteristic of the MISFET composing the memory cell, for example, the variation in the threshold voltage thereof occurs. The problem of the variation in the characteristic like this becomes more and more remarkable with the downsizing (shorter channel) of the device. FIG. 10 shows a sectional view taken along the direction in which the gate electrode 9 of the semiconductor substrate shown in FIG. 9 extends. Also, FIG. 11 is a plan view showing the principal part of the semiconductor substrate shown in FIGS. 9 and 10. FIG. 9 corresponds to the section taken along the line B-B in FIG. 11, and FIG. 10 corresponds to the section taken along the line C-C in FIG. 11. In this case, the H indicates the channel width in FIG. 11.

Contrary to this, since the dry oxidation in which the oxidation species is $O_2$ (oxygen) can be used in this embodiment, it is possible to restrain the oxidation of the semiconductor substrate and the gate electrode. As a result, the variance in the characteristic of the MISFET composing the memory cell can be reduced.

Also, in this embodiment, the over-etching of the polycrystalline silicon film 9a is performed so that about 10 to 40 nm thereof is etched. Therefore, it is possible to prevent the oxidation of the W film 9c and the WN film 9b that compose the gate electrode.

Figure 12:
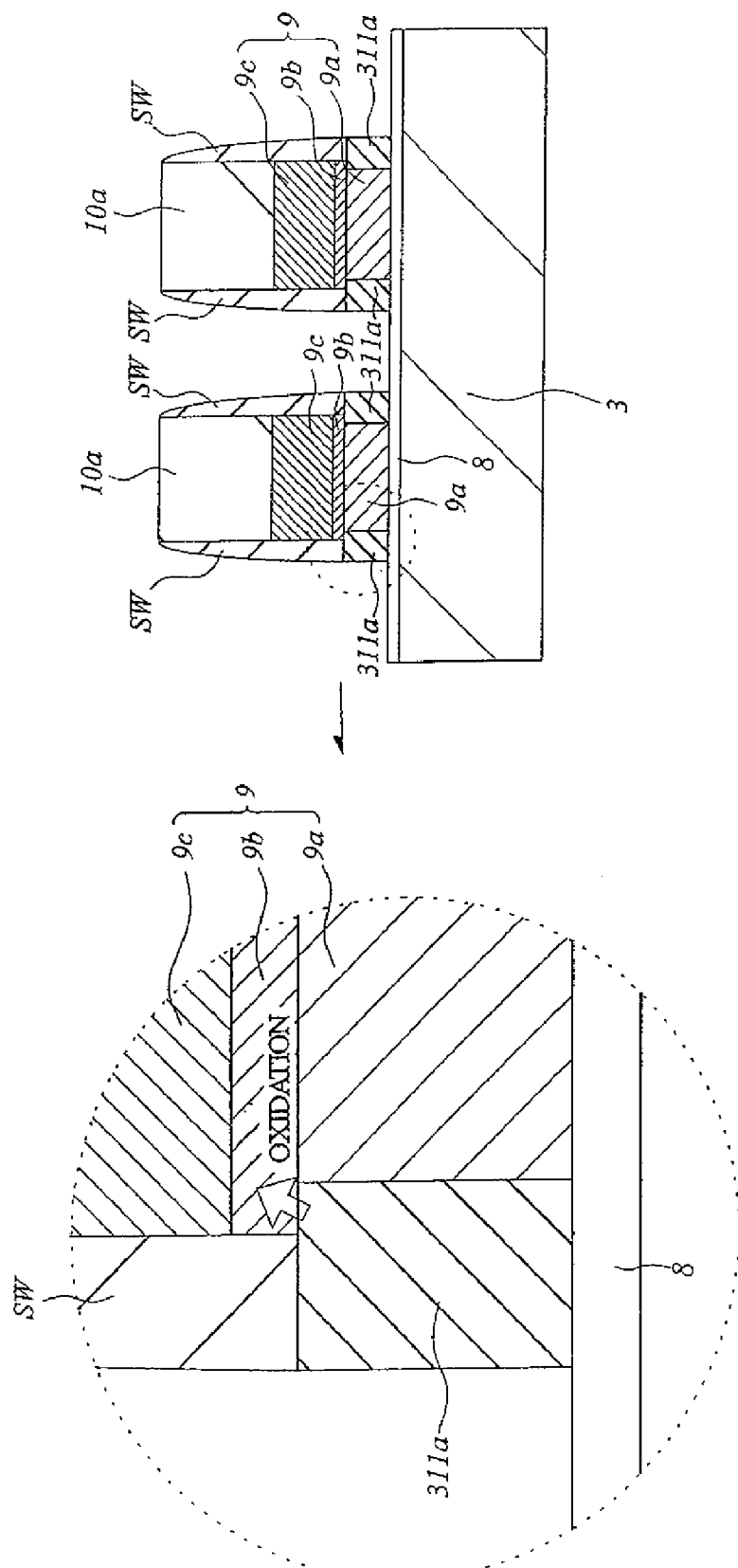
FIG. 12 is a sectional view showing the principal part of a substrate illustrating the growth of a light oxide film in a semiconductor integrated circuit device (DRAM), which is used to explain the effect of an embodiment of the present invention.
Figure 13:
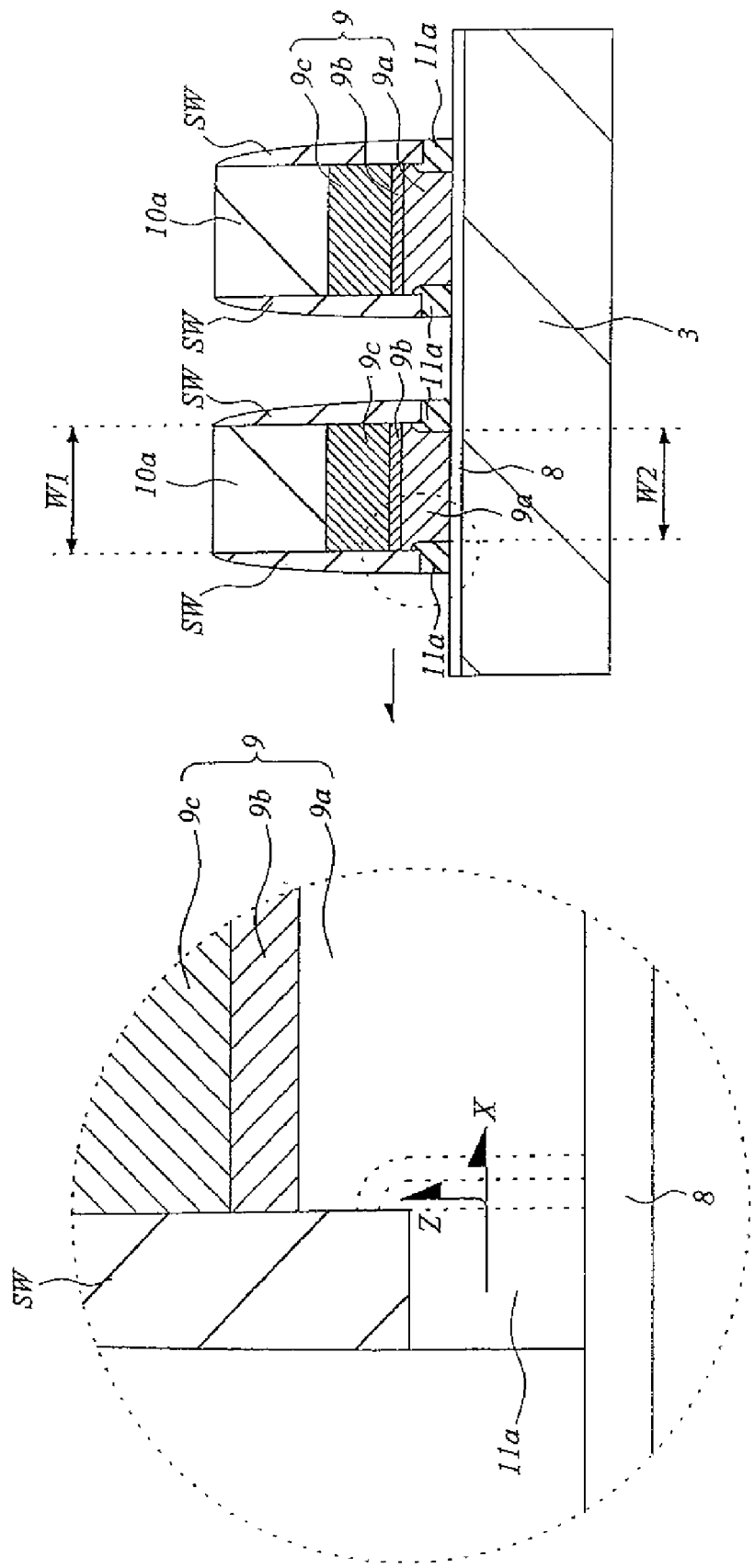
FIG. 13 is a sectional view showing the principal part of a substrate illustrating the growth of a light oxide film in a semiconductor integrated circuit device (DRAM) according to an embodiment of the present invention.

More specifically, as shown in FIG. 12, if the polycrystalline silicon film 9a is not over-etched at all, and the light oxide film 311a grown from the sidewall of the polycrystalline silicon film 9a is thicker than the sidewall film SW, the light oxide film 311a contacts to the WN film 9b, and as a result, the WN film 9b and the W film 9c formed thereon are oxidized. Particularly, when using the dry oxidation as described above, the WN film 9b and the W film 9c are easily oxidized.

Contrary to this, in this embodiment, since the over-etching of the polycrystalline silicon film 9a is performed so that about 10 to 40 nm thereof is etched, the light oxide film 11a grows in the direction (X direction) perpendicular to the direction (Y direction) in which the gate electrode 9 extends until the growth of the light oxide film reaches the position equal to the thickness of the sidewall film SW. Thereafter, the light oxide film 11a grows both of the X direction and the upper direction (Z direction). Therefore, a certain amount of time is required until the light oxide film grows to the position below the WN film 9b.

As a result, even in the case where the thickness of the light oxide film 11a is 7 nm which is larger than that of the sidewall film (5 nm), the light oxide film 11a does not contact to the WN film 9b, and the oxidation of the WN film 9b and the W film 9c formed thereon can be prevented. In other words, it is possible to interpose the polycrystalline film 9a between the light oxide film 11a and the WN film 9b. Consequently, the device characteristic of the MISFET can be improved, and the production yield can be improved.

Note that the larger the over-etching amount of the polycrystalline silicon film 9a, the larger the amount of margin for the light oxidation can be. Also, the thickness of the light oxide film 11a is sufficient if it can recover the damage due to the etching on the surface of the gate insulating film 8, and it does not have to be larger than that of the sidewall film SW.

More specifically, in this embodiment, the width W1 of the upper portion of the polycrystalline silicon film 9a after forming the light oxide film 11a is larger than the width W2 of the lower portion of the polycrystalline silicon film 9a (W1>W2). However, the relationship W1≦W2 is also applicable.

When the film thickness (D2) of the light oxide film 11a is smaller than that (D1) of the sidewall film SW, the relationship between the width W1 and the width W2 of the polycrystalline silicon film 9a is W≦W2. However, by setting the large margin for forming the light oxidation film, it becomes unnecessary to control the thickness of the sidewall film and the light oxide film so strictly. Also, the oxidation of the WN film 9b and the W film 9c due to the variation depending on the process can be prevented.

Figure 14:
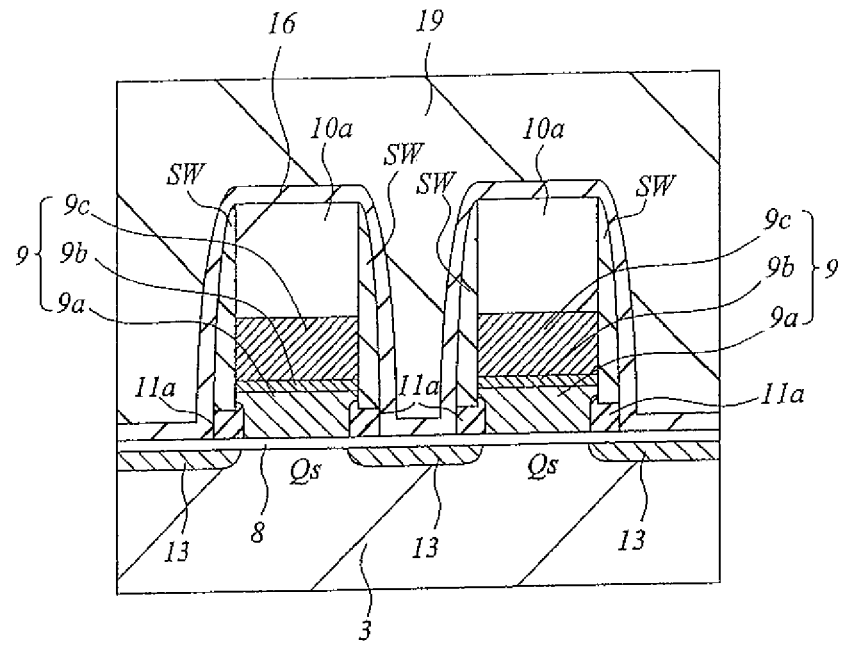
FIG. 14 is a sectional view showing the principal part of a substrate illustrating the method of manufacturing a semiconductor integrated circuit device (DRAM) according to an embodiment of the present invention.
Figure 15:
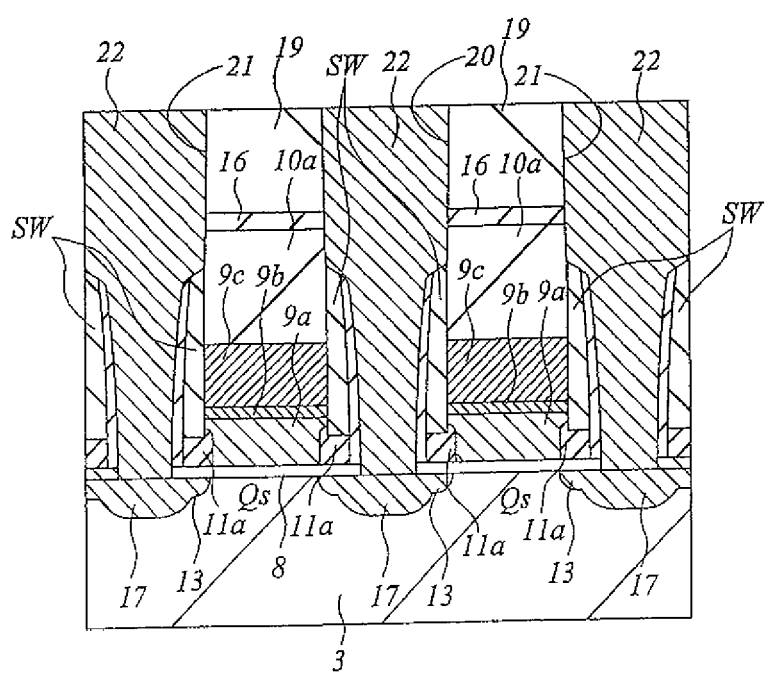
FIG. 15 is a sectional view showing the principal part of a substrate illustrating the method of manufacturing a semiconductor integrated circuit device (DRAM) according to an embodiment of the present invention.

Next, as shown in FIG. 14, an n$^-$-type semiconductor region 13 is formed by implanting n-type impurities (phosphorus) into the p-type well 3 positioned at the both sides of the gate electrode 9. Through the steps so far, the data transfer MISFET Qs of an n-channel type is formed in the memory cell array area.

Next, a silicon nitride film 16 is deposited to a thickness of about 50 nm over the semiconductor substrate 1 by the CVD method. The sum of the thickness of the silicon nitride film 16 and the remaining sidewall film SW is controlled so as to obtain a sufficient space for preventing the short-circuit between a terminal portion of a contact hole and the gate electrode 9 when forming contact holes 20 and 21 described later.

Subsequently, after depositing a silicon oxide film 19 to a thickness of about 500 nm over the semiconductor substrate 1 by the CVD method, the silicon oxide film 19 is polished by the CMP method to flatten the surface thereof.

Next, the silicon oxide film 19, the silicon nitride film 16, and the sidewall film SW are dry-etched with using a photoresist film (not shown) as a mask, thereby forming the contact holes 20 and 21 on the n$^-$-type semiconductor region 13. In this case, the etching of the silicon oxide film 19 is performed under the condition of high etching selectivity for the silicon nitride film (16 and SW), and the etching of the silicon nitride film 16 is performed under the condition of high etching selectivity for the silicon and the silicon oxide film. Thus, the contact holes 20 and 21 are formed in a self-alignment manner with respect to the gate electrode 9.

Next, the ions of the n-type impurities (phosphorus or arsenic) are implanted into the p-type well 3 (n$^-$-type semiconductor region 13) through the contact holes 20 and 21, thereby forming an n$^+$-type semiconductor region 17 (field relaxation layer).

Next, a plug 22 is formed in each of the contact holes 20 and 21. The plug 22 is formed in such a manner as follows. That is, a low-resistance polycrystalline silicon film doped with n-type impurities such as phosphorus (P) is first deposited to a thickness of about 300 nm on the silicon oxide film 19 and in the contact holes 20 and 21 by the CVD method, and then, the polycrystalline silicon film is etched back (or polished by the CMP method) and left only in the contact holes 20 and 21.

Figure 16:
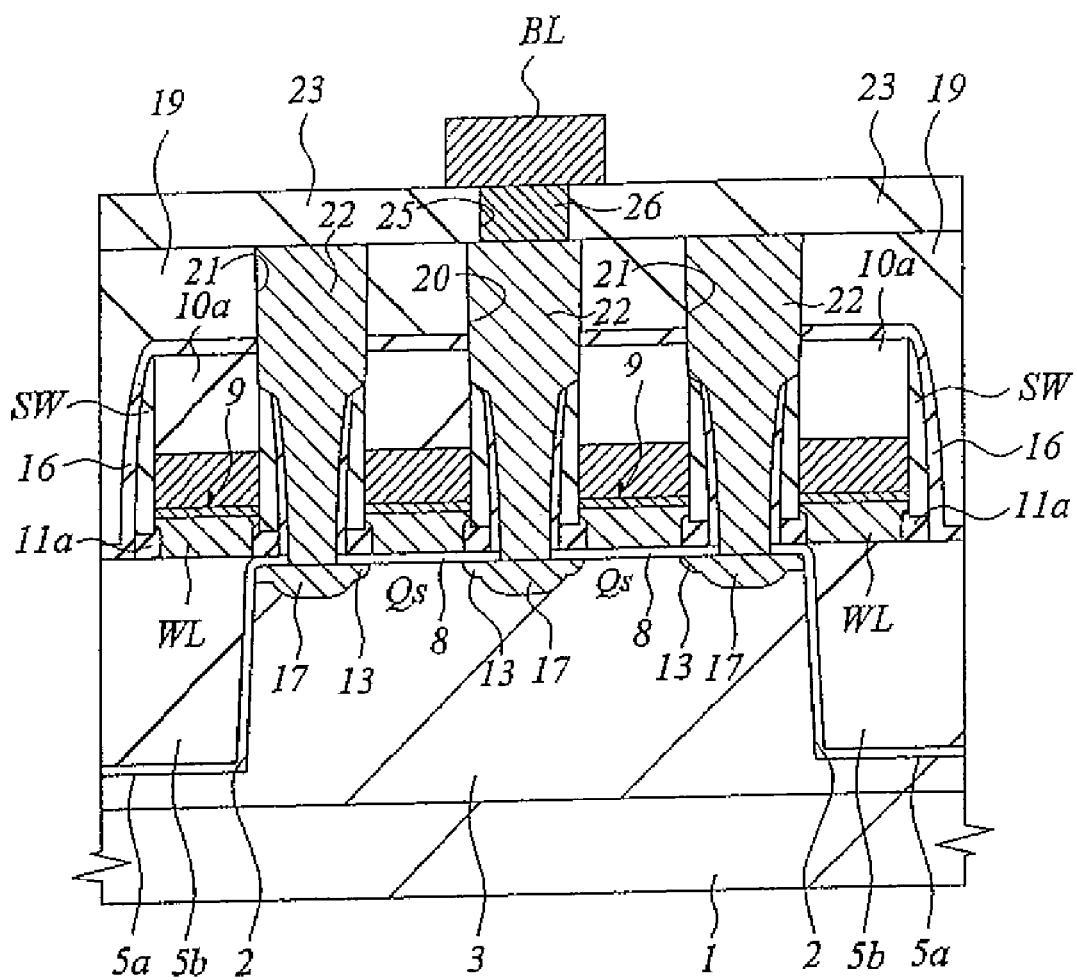
FIG. 16 is a sectional view showing the principal part of a substrate illustrating the method of manufacturing a semiconductor integrated circuit device (DRAM) according to an embodiment of the present invention.

Next, as shown in FIG. 16, after depositing a silicon oxide film 23 to a thickness of about 100 nm on the silicon oxide film 19 by the CVD method, a through hole 25 is formed on the plug 22 in the contact hole 20. Subsequently, a TiN (titanium nitride) film (not shown) and a W film are sequentially deposited on the silicon oxide film 23 and in the through hole 25. Thereafter, the TiN film and the W film outside the through hole 25 are polished by the CMP method, and thus, a plug 26 is formed.

Next, a bit line BL is formed on the plug 26. The bit line BL is formed in such a manner as follows. That is, after depositing a W film to a thickness of about 100 nm by the sputtering method on the silicon oxide film 23 and on the plug 26, the W film is dry-etched to form the bit line BL.

Figure 17:
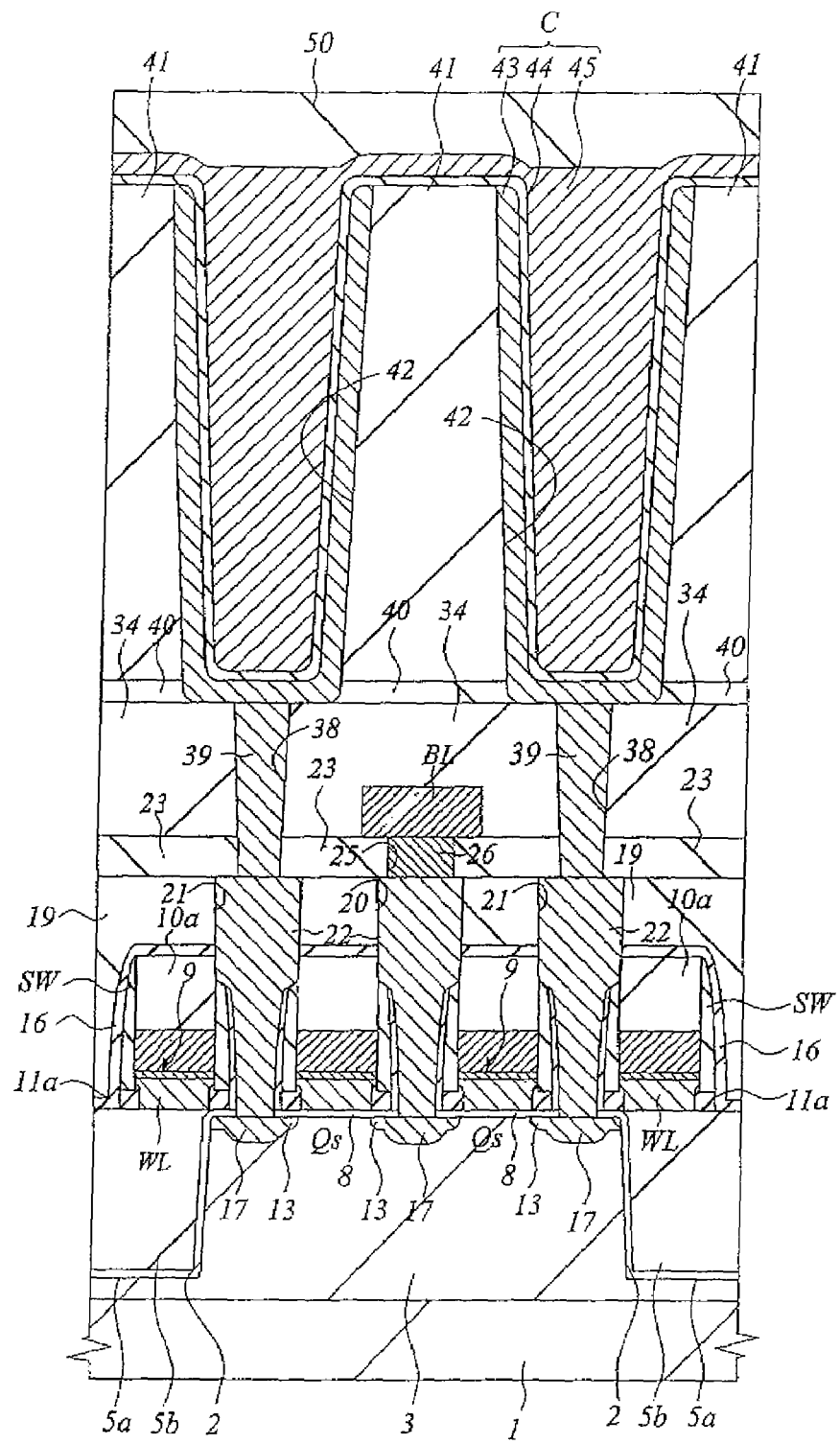
FIG. 17 is a sectional view showing the principal part of a substrate illustrating the method of manufacturing a semiconductor integrated circuit device (DRAM) according to an embodiment of the present invention.

Next, as shown in FIG. 17, a silicon oxide film 34 is deposited on the bit line BL by the CVD method. Subsequently, the silicon oxide film 34 and the silicon oxide film 23 formed on the plugs 22 in the contact holes 21 are dry-etched to form through holes 38. Subsequently, after depositing a conductive film such as a W film on the silicon oxide film 34 and in the through holes 38 by the CVD method, the conductive film outside the through holes 38 is polished off by the CMP method, thereby forming plugs 39.

A silicon nitride film 40 is deposited on the silicon oxide film 34 and on the plugs 39 by the CVD method, and then, a silicon oxide film 41 is deposited on the silicon nitride film 40 by the CVD method. Thereafter, the silicon oxide film 41 and the silicon nitride film 40 are dry-etched, thereby forming trenches 42 on the plugs 39.

Next, after depositing a conductive film such as a low-resistance polycrystalline silicon film doped with n-type impurities such as phosphorus (P) on the silicon oxide film 41 and in the trenches 42 by the CVD method, a photoresist film or the like is buried in the trenches 42. Then, the conductive film on the silicon oxide film 41 is etched back, thereby leaving the conductive film only on the inner wall of the trenches 42. Thus, a lower electrode 43 of the data storage capacitor C is formed along the inner wall of the trench 42.

Figure 18:
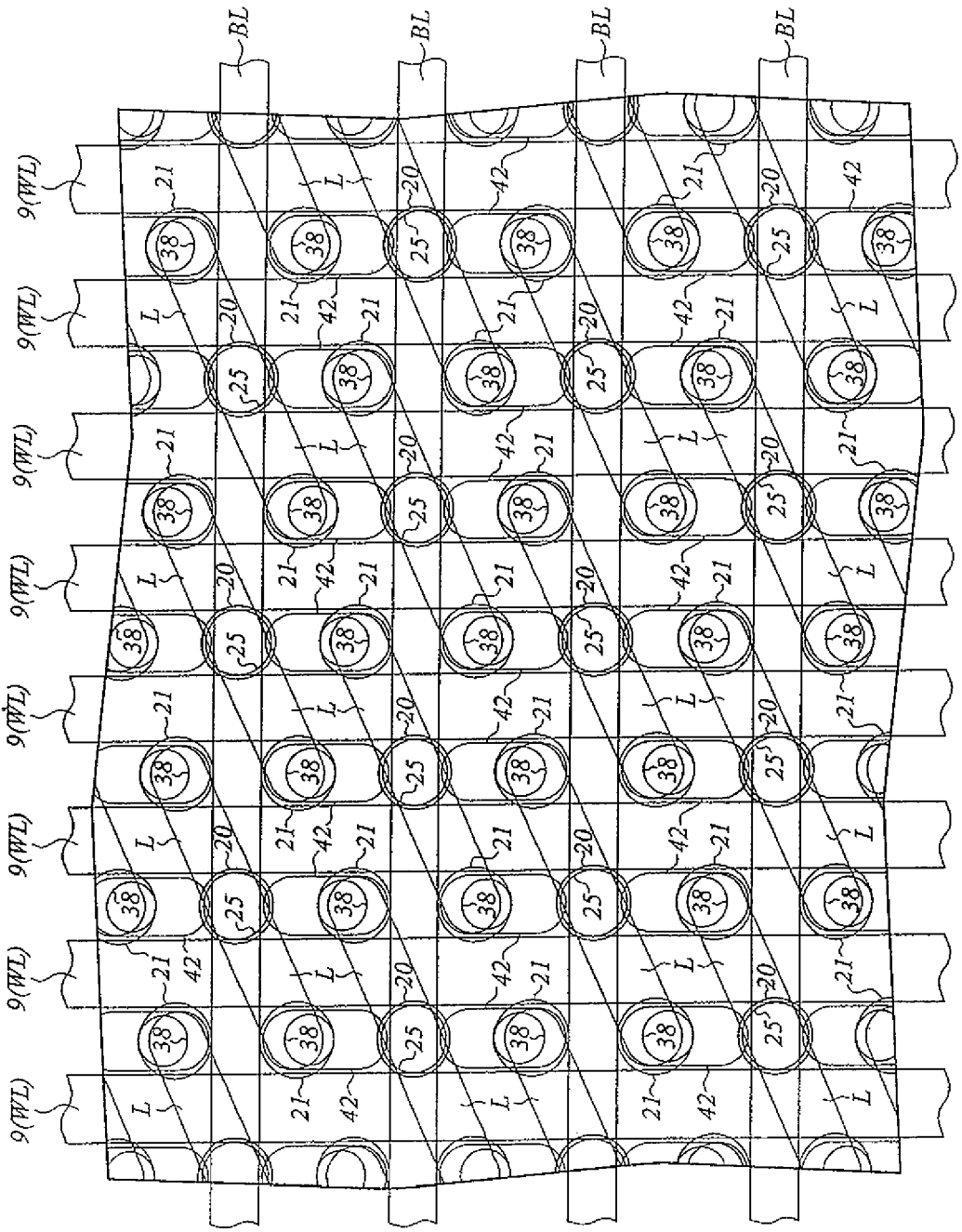
FIG. 18 is a plan view showing the principal part of a substrate illustrating the method of manufacturing a semiconductor integrated circuit device (DRAM) according to an embodiment of the present invention.

Next, a capacitor insulating film 44 comprising a tantalum oxide film and the like and an upper electrode 45 comprising a conductive film such as a TiN film are formed on the lower electrode 43, thereby forming the data storage capacitor C. FIG. 18 is a plan view showing the principal part of the substrate after forming the data storage capacitor C.

Through the steps so far, a memory cell of the DRAM comprising the data transfer MISFET Qs and the data storage capacitor C connected thereto in series is completed.

Subsequently, a silicon oxide film 50 is deposited over the semiconductor substrate 1 by the CVD method, and about two layers of wirings (not shown) are formed, and thus, the DRAM according to the embodiment is almost completed.

In the foregoing, the inventions made by the inventors thereof have been described based on the embodiment in detail. However, it goes without saying that the present invention is not limited to the embodiment and various changes and modifications can be made within the scope of the present invention. Particularly, in the descriptions of the embodiment, the memory cell of a DRAM is taken as an example. However, the present invention can be widely applied to a semiconductor integrated circuit device including a gate electrode in which a silicon film and a metal film are provided and an oxide film is formed on a sidewall of the silicon film.

The advantages achieved by the typical ones of the invention disclosed in this application will be briefly described as follows.

After a second insulating film, a refractory metal film, and a predetermined thickness of a silicon film, which are deposited on a first insulating film formed on a semiconductor substrate, are etched and removed so as not to expose the first insulating film, a third insulating film is selectively formed on a sidewall of the silicon film and on a sidewall of the refractory metal film. Also, after removing a part of the silicon film not covered with the third insulating film, a thermal treatment is performed to a surface of the silicon film in an oxidation atmosphere. Therefore, it is possible to prevent the contamination on the first insulating film due to the refractory metal and the oxide thereof, and the diffusion of the materials into the semiconductor substrate and the resultant increase of a leak current can be prevented.

Consequently, it is possible to improve the characteristic of the semiconductor integrated circuit device, and the yield thereof can also be improved.

What is claimed is:

1. A semiconductor device comprising:
   a semiconductor substrate having a main surface;
   a first insulating film formed on the main surface of the semiconductor substrate;
   a silicon film formed on the first insulating film, which has a first sidewall positioned adjacent to the first insulating film and a second sidewall positioned apart from the first insulating film;
   a refractory metal film formed above the silicon film and having a third sidewall;
   a second insulating film formed on the second and third sidewalls; and
   a third insulating film formed on the first sidewall, wherein a lower edge of the second insulating film is located not less than 10 nanometers below an upper edge of the silicon film.

2. The device of claim 1, further comprising a barrier layer inserted between the silicon film and the refractory metal film.

3. The device of claim 2, wherein the barrier layer is formed to prevent the polysilicon layer from forming a silicide layer with the refractory metal.

4. The device of claim 2, wherein the barrier layer comprises nitride of a metal.

5. The device of claim 2, wherein the barrier layer comprises a tungsten nitride.

6. The device of claim 1, wherein the refractory metal is made of tungsten.

7. The device of claim 1, wherein the lower edge of the second insulating film is located not more than 40 nanometers below an upper edge of the silicon film.

8. The device of claim 1, wherein the second insulating film comprises a silicon nitride film and the third insulating film comprises a silicon oxide film.

9. A semiconductor device having a multilayer gate structure for a field effect transistor device, the field effect transistor device having an active region formed within a semiconductor substrate beneath a gate dielectric covering a substrate surface of the semiconductor substrate, the gate stack structure comprising:
   a polysilicon layer formed on the gate dielectric;
   a metal layer;
   a barrier layer formed between the polysilicon layer and the metal layer;
   a first dielectric passivation liner covering upper sidewall portions of the gate stack structure above a liner edge; and
   a second dielectric sidewall liner covering a lower sidewall portion below the liner edge;
   wherein the liner edge is located not less than 10 nanometers below an upper edge of the polysilicon layer.

10. The device of claim 9, wherein the barrier layer is formed to prevent the polysilicon layer from forming a silicide layer with the metal layer.

11. The device of claim 10, wherein the barrier layer comprises nitride of a metal.

12. The device of claim 11, wherein the metal layer comprises a refractory metal.

13. The device of claim 12, wherein the refractory metal is tungsten.

14. The device of claim 9, wherein the liner is located not more than 40 nanometers below an upper edge of the polysilicon film.

15. The device of claim 9, wherein the first dielectric sidewall liner comprises a silicon oxide film and the second dielectric sidewall liner comprises a silicon nitride film.

* * * * *